(12) United States Patent
Okami

(10) Patent No.: US 10,026,524 B2
(45) Date of Patent: *Jul. 17, 2018

(54) ELECTRODE SUBSTRATE FILM AND METHOD OF MANUFACTURING THE SAME

(71) Applicant: SUMITOMO METAL MINING CO., LTD., Tokyo (JP)

(72) Inventor: Hideharu Okami, Niihama (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/501,336

(22) PCT Filed: Aug. 25, 2015

(86) PCT No.: PCT/JP2015/073801
§ 371 (c)(1),
(2) Date: Feb. 2, 2017

(87) PCT Pub. No.: WO2016/031802
PCT Pub. Date: Mar. 3, 2016

(65) Prior Publication Data
US 2017/0221600 A1    Aug. 3, 2017

(30) Foreign Application Priority Data
Aug. 27, 2014  (JP) .................. 2014-172605

(51) Int. Cl.
*H05K 1/09* (2006.01)
*H01B 5/14* (2006.01)
(Continued)

(52) U.S. Cl.
CPC ............... *H01B 5/14* (2013.01); *B32B 7/02* (2013.01); *B32B 15/04* (2013.01);
(Continued)

(58) Field of Classification Search
CPC .......... B32B 7/02; B32B 15/04; B32B 15/08; B32B 2307/412; B32B 2307/418;
(Continued)

(56) References Cited

U.S. PATENT DOCUMENTS

2004/0142111 A1 * 7/2004 Shibata ............... H01L 31/0392
427/372.2
2010/0215937 A1 * 8/2010 Matsukawa ............ C08G 18/44
428/221
(Continued)

FOREIGN PATENT DOCUMENTS

JP   2003-151358 A1   5/2003
JP   2011-018194 A1   1/2011
(Continued)

OTHER PUBLICATIONS

International Search Report for International Application No. PCT/JP2015/073801 dated Nov. 2, 2015.

*Primary Examiner* — Timothy Thompson
*Assistant Examiner* — Guillermo Egoavil
(74) *Attorney, Agent, or Firm* — Kratz, Quintos & Hanson, LLP

(57) ABSTRACT

[Object] Provided are an electrode substrate film which does not cause trouble in a process to create a circuit pattern formed of a metal thin line and in which the circuit pattern is less visible even under highly bright illumination, and a method of manufacturing the same.

[Solving Means] An electrode substrate film with a transparent substrate 52 and a metal laminate thin line includes a metal absorption layer 51 with a film thickness of 20 nm to 30 nm inclusive as a first layer, and a metal layer 50 as a second layer, counted from the transparent substrate side. Optical constants of the metal absorption layer in a visible wavelength range (400 to 780 nm) satisfy conditions that a refractive index is 1.8 to 2.2 and an extinction coefficient is (Continued)

1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm. The highest reflectance in the visible wavelength range attributed to reflection at an interface between the transparent substrate and the metal absorption layer is 40% or less.

9 Claims, 5 Drawing Sheets

(51) Int. Cl.
*B32B 7/02* (2006.01)
*B32B 15/04* (2006.01)
*C23C 14/00* (2006.01)
*C23C 14/08* (2006.01)
*H01B 13/00* (2006.01)

(52) U.S. Cl.
CPC .......... *C23C 14/0063* (2013.01); *C23C 14/08* (2013.01); *H01B 13/0036* (2013.01); *B32B 2307/412* (2013.01); *B32B 2307/418* (2013.01); *B32B 2309/105* (2013.01)

(58) Field of Classification Search
CPC ... B32B 2309/105; C23C 14/06; C23C 14/08; C23C 14/0063; G06F 3/041; G06F 3/044; G06F 3/045; G06F 2203/04103; G06F 2203/04112; H01B 1/08; H01B 5/14; H01B 13/00; H01B 13/0036; H05K 1/09; H05K 1/0274; H05K 1/0298; H05K 3/10; H05K 3/16; H05K 3/4644; H05K 7/02; H05K 2201/0317; H01L 31/05; H01L 31/18; H01L 31/02366; Y10T 29/49155
USPC ............ 136/256; 174/257; 204/15; 361/748, 361/174; 427/97.3
See application file for complete search history.

(56) References Cited

U.S. PATENT DOCUMENTS

| | | | |
|---|---|---|---|
| 2013/0140065 | A1 | 6/2013 | Koo |
| 2015/0075596 | A1* | 3/2015 | Lim ........................ G06F 3/041 |
| | | | 136/256 |
| 2015/0316290 | A1* | 11/2015 | Liu ........................ C23C 14/165 |
| | | | 126/676 |
| 2018/0046005 | A1* | 2/2018 | Yoon ...................... G02F 1/1343 |

FOREIGN PATENT DOCUMENTS

| | | |
|---|---|---|
| JP | 2013-069261 A1 | 4/2013 |
| JP | 2013-225276 A1 | 10/2013 |
| JP | 2014-513335 A1 | 5/2014 |
| JP | 2014-142462 A1 | 8/2014 |

* cited by examiner

[Fig.1]
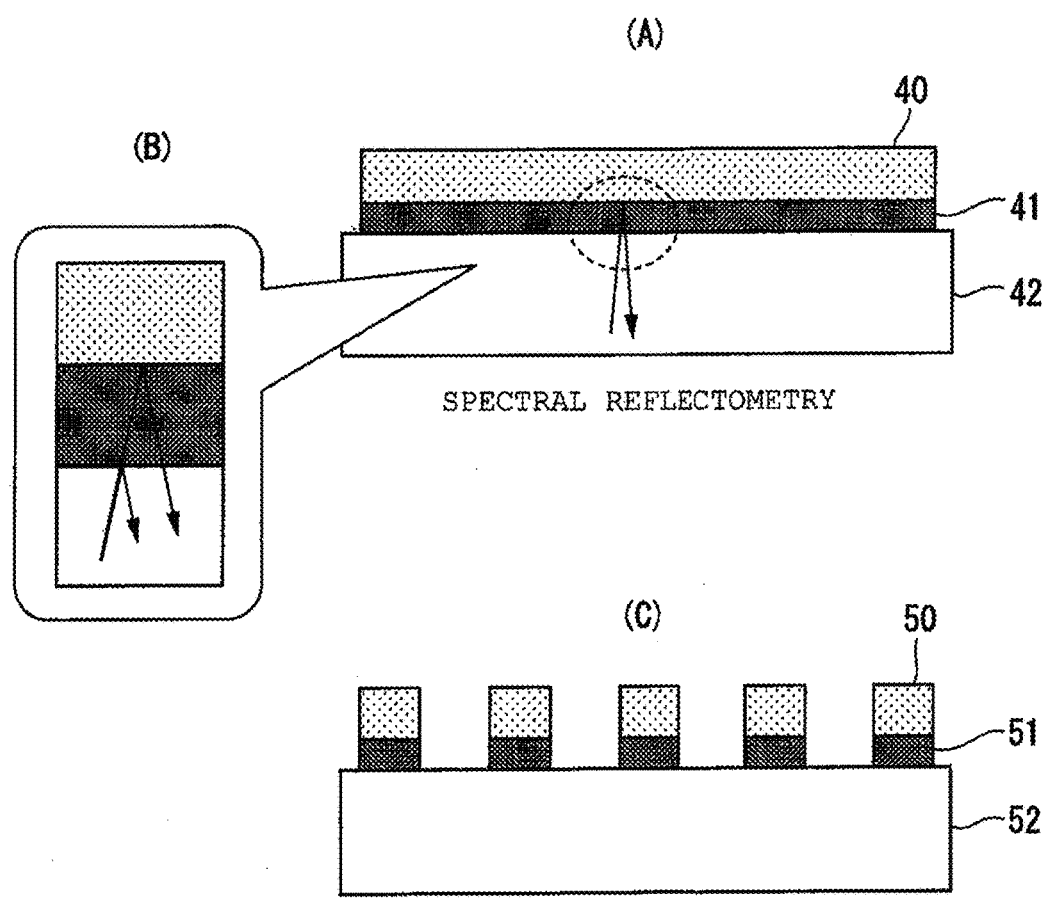

[Fig.2]
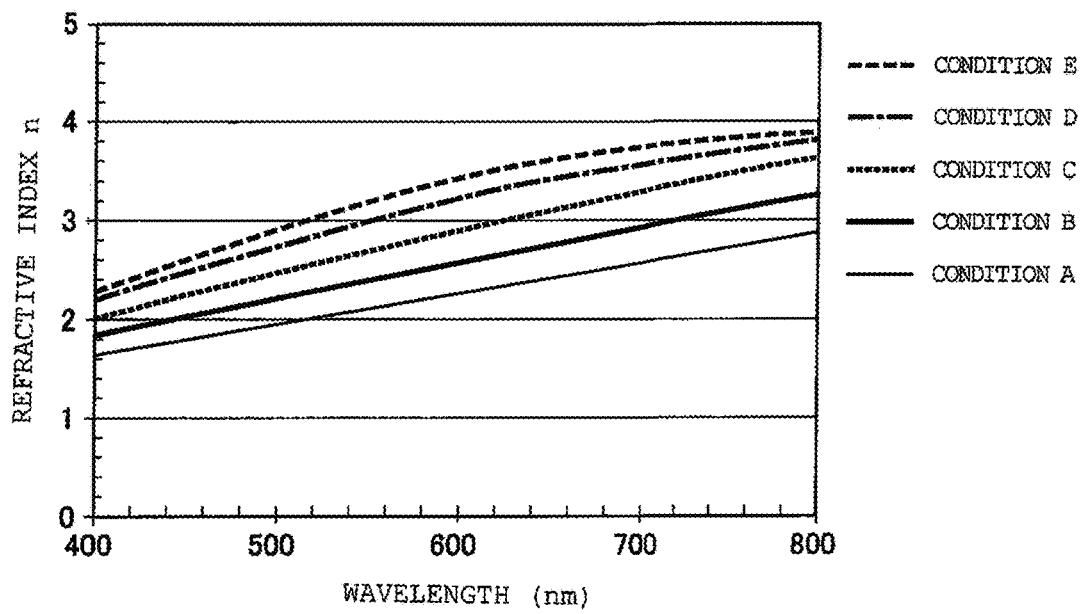
[Fig.3]
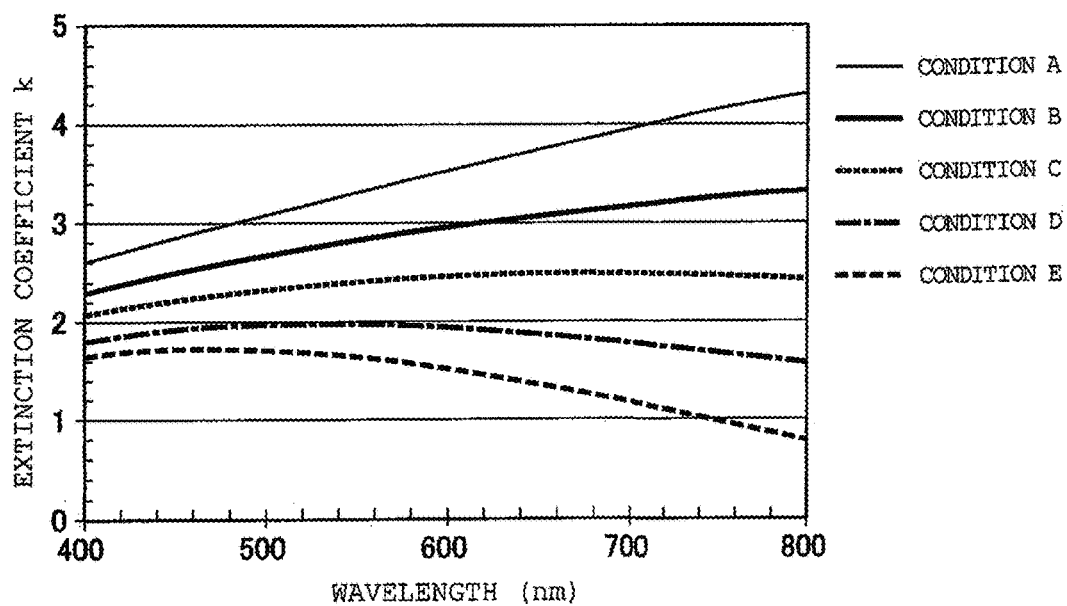

[Fig.4]
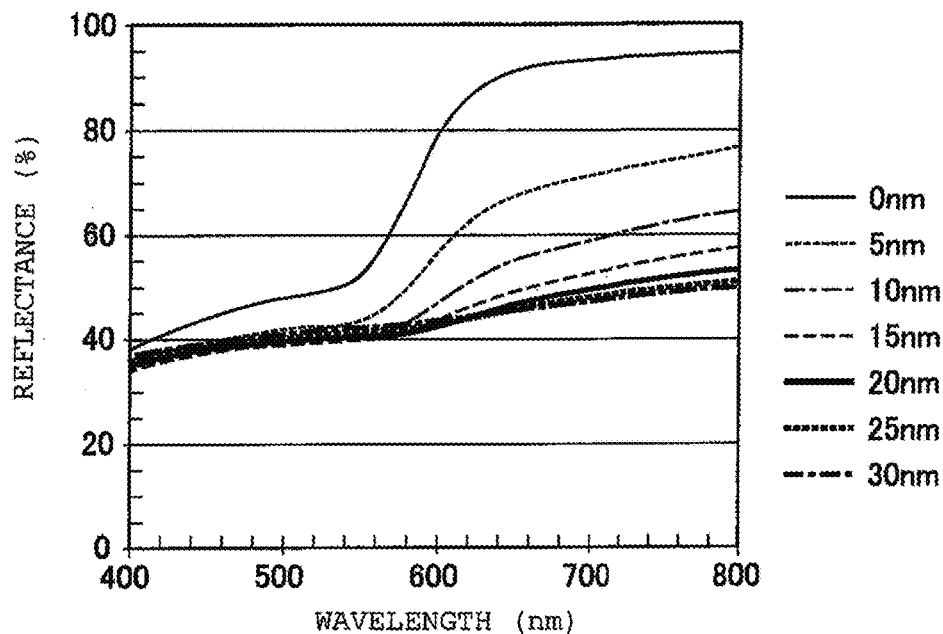
[Fig.5]
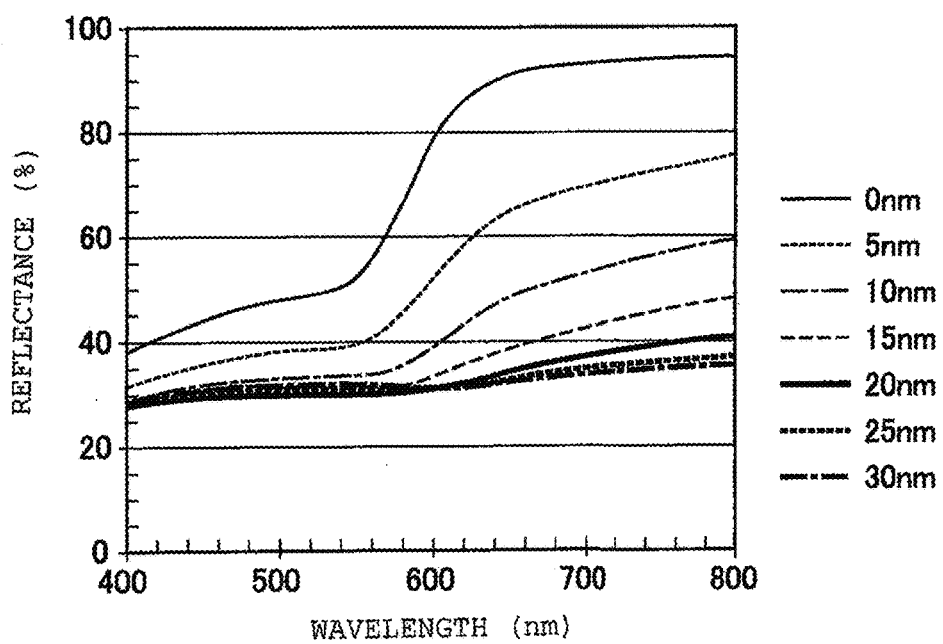

[Fig.6]
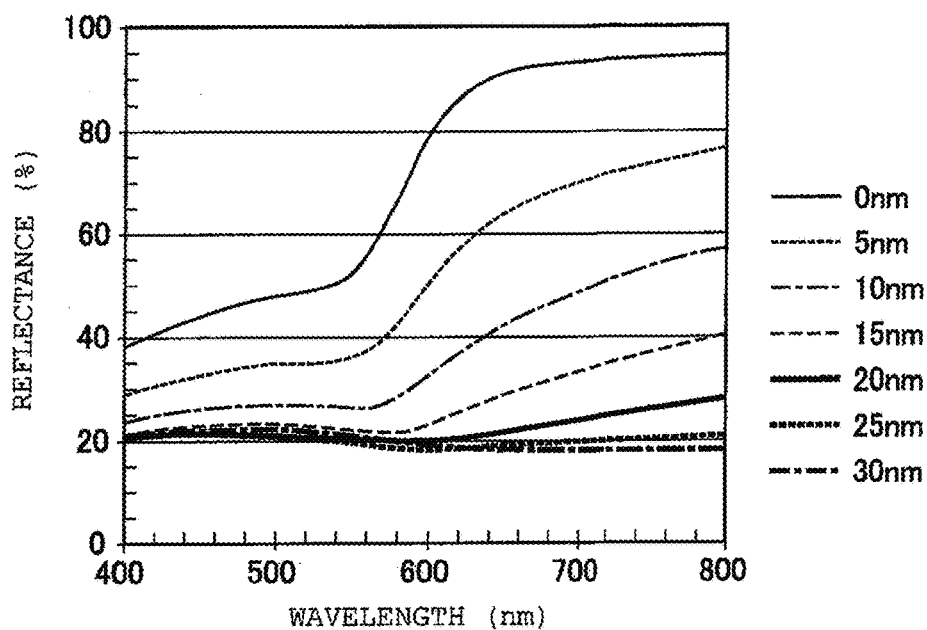
[Fig.7]
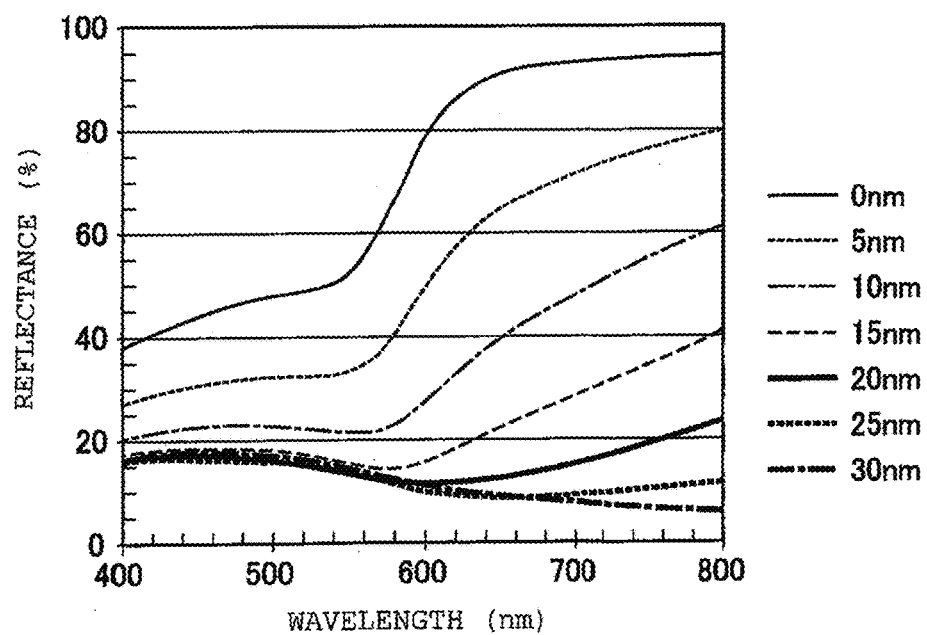

[Fig.8]
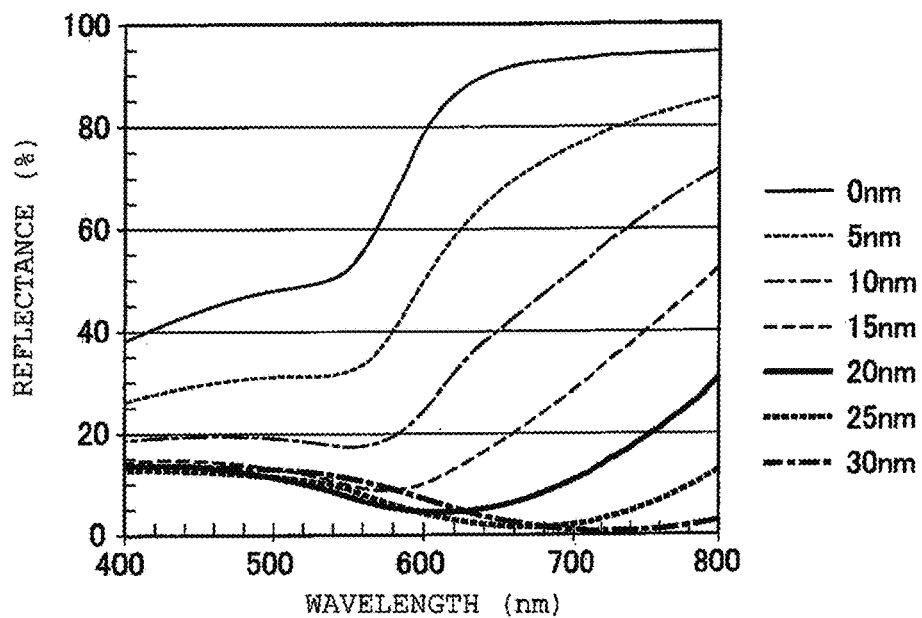
[Fig.9]
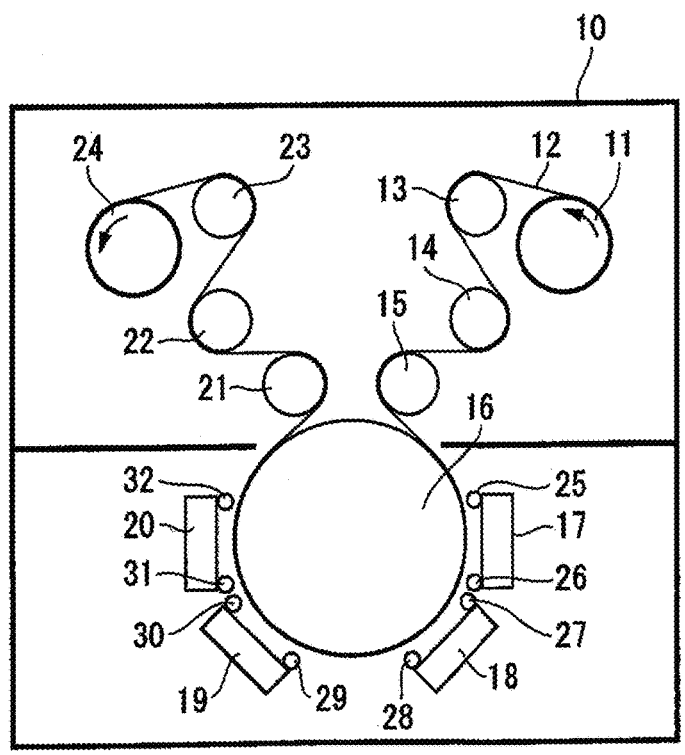

ELECTRODE SUBSTRATE FILM AND METHOD OF MANUFACTURING THE SAME

TECHNICAL FIELD

The present invention relates to an electrode substrate film which has a transparent substrate formed of a resin film and a circuit pattern of electrodes and the like, and is applied to a touch panel or the like, and particularly to an electrode substrate film which does not cause trouble in a process to create a circuit pattern and in which the created circuit pattern is less visible even under highly bright illumination, and a method of manufacturing the same.

BACKGROUND ART

In late years, "touch panels" have come to be widely used which are installed on surfaces of flat panel displays (FPD) included in a mobile phone, a portable device for electronic documents, a vending machine, a car navigation system, and the like.

The "touch panels" described above are largely divided into resistive ones and capacitive ones. The "resistive touch panel" has a main part which includes a transparent substrate formed of a resin film, an X-coordinate- (or Y-coordinate-) detecting electrode sheet and a Y-coordinate- (or X-coordinate-) detecting electrode sheet provided on the substrate, and an insulating spacer provided between these sheets. Here, although the X-coordinate-detecting electrode sheet and the Y-coordinate-detecting electrode sheet described above are spatially separated, both coordinate-detecting electrode sheets are configured to come into electrical contact with each other when pressed by a pen or the like, and to detect the position (X-coordinate and Y-coordinate) which the pen touched. The sheets are designed to trace the movement of the pen and recognize its coordinates, making it possible for the character to be inputted as a result. On the other hand, the "capacitive touch panel" has a structure where an X-coordinate- (or Y-coordinate-) detecting electrode sheet and a Y-coordinate- (or X-coordinate-) detecting electrode sheet are laminated with an insulating sheet in between, and an insulator such as glass is dispose on these. With this setup, when a finger approaches the above-described insulator such as glass, the sheets detect the position because electric capacitances of the X-coordinate-detecting electrode and the Y-coordinate-detecting electrode change.

Conventionally, transparent conductive films formed of ITO (indium oxide-tin oxide) and the like have been widely used as a conductive material for a circuit pattern of electrodes and the like (see Patent Document 1). Along with an increase in size of touch panels, mesh-structure metal thin lines as disclosed in Patent Document 2, Patent Document 3, and the like are beginning to be used.

Here, comparison between the transparent conductive film and the metal thin line described above shows the transparent conductive film has an advantage that, due to its excellent transmittance in a visible wavelength range, the circuit pattern of electrodes and the like is less visible, but the transparent conductive film has a disadvantage that it is unsuitable for the purpose of increasing the size and response speed of touch panels because its electrical resistance value is higher than that of the metal thin line. The metal thin line, on the other hand, is suitable for the purpose of increasing the size and response speed of touch panels because of its low electrical resistance value, but has a disadvantage that, due to a high reflectance in the visible wavelength range, the circuit pattern may be visible under highly bright illumination even if the metal thin line is formed into a fine mesh structure, which results in a decrease in product value.

A possible method of reducing the reflectance of the metal thin line in the visible wavelength range is to combine a metal film and a dielectric multilayered film to create an anti-reflective film. However, the method of combining the metal film and the dielectric multilayered film is not preferable because the metal thin line for the circuit pattern of electrodes and the like is formed by etching.

In such a technical background, a method has been proposed which reduces reflection on the metal film observed from the resin film side by, for example, forming a blackened layer between the resin film and the metal film by electrolytic plating or the like (see Patent Document 4), or providing a light absorbing layer (metal absorption layer) made of a metal oxide between the resin film and the metal film (see Patent Document 5).

CONVENTIONAL ART DOCUMENTS

Patent Documents

Patent Document 1: Japanese Patent Application Publication No. 2003-151358 (see claim 2)
Patent Document 2: Japanese Patent Application Publication No. 2011-018194 (see claim 1)
Patent Document 3: Japanese Patent Application Publication No. 2013-069261 (see paragraph 0004)
Patent Document 4: Japanese Patent Application Publication No. 2014-142462 (see claim 5 and paragraph 0038)
Patent Document 5: Japanese Patent Application Publication No. 2013-225276 (see claim 1 and paragraph 0041)

SUMMARY OF THE INVENTION

Problems to be Solved by the Invention

However, there is a problem that provision of a blackened layer and a metal absorption layer may adversely increase reflection depending on the spectral optical characteristics of the blackened layer and the metal absorption layer proposed in Patent Documents 4 and 5, making it difficult to select a constituent material and a deposition condition. There is also a problem that the constituent material of the metal absorption layer may cause trouble in etching, deteriorating the processing accuracy in creating the circuit pattern of electrodes and the like.

The present invention has been made in view of these problems, and an object thereof is to provide an electrode substrate film which does not cause trouble in the process to create a circuit pattern and in which the created circuit pattern is less visible even under highly bright illumination, and a method of manufacturing the same.

Means for Solving the Problems

Given the above situation, for the purpose of solving the above-described problems, experiments were repeatedly carried out for deposition of the metal absorption layer, simulation of the optical thin-film, and the etching property or the like of the metal absorption layer. As a result, the present inventor has found that there exist the optimum optical constants (refractive index and extinction coefficient) and film thickness condition of the metal absorption layer which make a spectral reflectance low in a visible wavelength range (400 to 780 nm) and enable etching without difficulty. Furthermore, the inventor also confirmed that it is possible to increase a line width of a metal thin line for a circuit pattern of electrodes and the like because the reflectance in the visible wavelength range can be reduced. The present invention has been completed based on such technical findings.

In summary, a first aspect of the present invention is an electrode substrate film including a transparent substrate formed of a resin film, and a mesh circuit pattern provided on the transparent substrate and formed of a metal laminate thin line, characterized in that the laminate thin line includes a metal absorption layer with a film thickness of 20 nm to 30 nm inclusive as a first layer, and a metal layer as a second layer, counted from the transparent substrate side, optical constants of the metal absorption layer in a visible wavelength range (400 to 780 nm) satisfy conditions that a refractive index is 1.8 to 2.2 and an extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm, and a highest reflectance in the visible wavelength range (400 to 780 nm) attributed to reflection at an interface between the transparent substrate and the metal absorption layer and an interface between the metal absorption layer and the metal layer is 40% or less.

A second aspect of the invention is the electrode substrate film described in the first aspect, characterized in that the metal laminate thin line includes a second metal absorption layer with a film thickness of 20 nm to 30 nm inclusive as a third layer, counted from the transparent substrate side, and optical constants of the second metal absorption layer in the visible wavelength range (400 to 780 nm) satisfy conditions that a refractive index is 1.8 to 2.2 and an extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm.

A third aspect of the invention is the electrode substrate film described in the first aspect or the second aspect, characterized in that a deposition material of the metal absorption layer includes Ni alone or a Ni-based alloy containing at least one element selected from Ti, Al, V, W, Ta, Si, Cr, Ag, Mo, and Cu, or Cu alone or a Cu-based alloy containing at least one element selected from Ti, Al, V, W, Ta, Si, Cr, Ag, Mo, and Ni.

A fourth aspect of the invention is the electrode substrate film described in any one of the first to third aspects, characterized in that the metal absorption layer is formed by a vacuum deposition method, and the optical constants of the metal absorption layer, which are the refractive index and the extinction coefficient, are adjusted by introducing the deposition material described in the third aspect and a reactive gas into a deposition apparatus in which the vacuum deposition method is carried out.

A fifth aspect of the invention is the electrode substrate film described in the fourth aspect, characterized in that the reactive gas includes oxygen or nitrogen gas alone, a gas mixture thereof, or a gas mixture with oxygen and nitrogen as main components.

A sixth aspect of the invention is the electrode substrate film described in the first aspect, characterized in that a film thickness of the metal layer ranges from 50 nm to 5000 nm inclusive.

Next, a seventh aspect of the invention according to the present invention is a method of manufacturing an electrode substrate film which includes a transparent substrate formed of a resin film, and a mesh circuit pattern provided on the transparent substrate and formed of a metal laminate thin line, characterized in that the method comprises:

a first step of manufacturing a laminate film which includes the transparent substrate and a layered film, and has a highest reflectance in a visible wavelength range (400 to 780 nm) attributed to reflection at an interface between the transparent substrate and a metal absorption layer and an interface between the metal absorption layer and a metal layer is 40% or less, by depositing, in a vacuum deposition method, the metal absorption layer as a first layer and the metal layer as a second layer of the layered film, counted from the transparent substrate side, the metal absorption layer having a film thickness of 20 nm to 30 nm inclusive, and optical constants thereof in the visible wavelength range (400 to 780 nm) satisfying conditions that a refractive index is 1.8 to 2.2 and an extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm; and a second step of etching the layered film of the thus-obtained laminate film into the laminate thin line.

An eighth aspect of the invention is the method of manufacturing an electrode substrate film described in the seventh aspect, characterized in that a deposition material of the metal absorption layer includes Ni alone or a Ni-based alloy containing at least one element selected from Ti, Al, V, W, Ta, Si, Cr, Ag, Mo, and Cu, or Cu alone or a Cu-based alloy containing at least one element selected from Ti, Al, V, W, Ta, Si, Cr, Ag, Mo, and Ni.

A ninth aspect of the invention is the method of manufacturing an electrode substrate film described in the seventh aspect or the eighth aspect, characterized in that the metal absorption layer with adjusted optical constants, which are the refractive index and the extinction coefficient, are formed by introducing the deposition material described in the eighth aspect and a reactive gas into a deposition apparatus in which the vacuum deposition method is carried out, and by controlling a deposition condition inside the deposition apparatus.

Finally, a tenth aspect of the invention is
the method of manufacturing an electrode substrate film described in any one of the seventh to the ninth aspect, characterized in that
the reactive gas includes oxygen or nitrogen gas alone, a gas mixture thereof, or a gas mixture with oxygen and nitrogen as main components.

Effects of the Invention

An electrode substrate film according to the present invention including a transparent substrate formed of a resin film, and a mesh circuit pattern provided on the transparent substrate and formed of a metal laminate thin line is characterized in that
the laminate thin line includes a metal absorption layer with a film thickness of 20 nm to 30 nm inclusive as a first layer, and a metal layer as a second layer, counted from the transparent substrate side,
optical constants of the metal absorption layer in a visible wavelength range (400 to 780 nm) satisfy conditions that
a refractive index is 1.8 to 2.2 and an extinction coefficient is 1.8 to 2.4 at a wavelength of 400 nm,
the refractive index is 2.2 to 2.7 and the extinction coefficient is 1.9 to 2.8 at a wavelength of 500 nm,
the refractive index is 2.5 to 3.2 and the extinction coefficient is 1.9 to 3.1 at a wavelength of 600 nm,
the refractive index is 2.7 to 3.6 and the extinction coefficient is 1.7 to 3.3 at a wavelength of 700 nm, and
the refractive index is 3.1 to 3.8 and the extinction coefficient is 1.5 to 3.4 at a wavelength of 780 nm, and
a highest reflectance in the visible wavelength range (400 to 780 nm) attributed to reflection at an interface between the transparent substrate and the metal absorption layer and an interface between the metal absorption layer and the metal layer is 40% or less.

Moreover, the highest reflectance in the visible wavelength range (400 to 780 nm) attributed to reflection at an interface between the transparent substrate and the metal absorption layer and an interface between the metal absorption layer and the metal layer is a low value of 40% or less. For this reason, it is possible to provide an electrode substrate film in which the circuit pattern of electrodes and the like provided on the transparent substrate is less visible under highly bright illumination. Besides, it is possible to provide an electrode substrate film with which excellent processing accuracy can be achieved in creating the circuit pattern of electrodes and the like because it does not cause trouble in etching. Furthermore, a metal laminate thin line with a larger line width compared to a conventional one can be applied. Thus, the present invention has an effect that it can provide an electrode substrate film with a low electrical resistance value.

BRIEF DESCRIPTION OF THE DRAWINGS

FIG. 1(A) is a cross-sectional view illustrating a structure of a laminate film used for manufacture of an electrode substrate film according to the present invention, FIG. 1(B) is a partially enlarged view of FIG. 1(A), and FIG. 1(C) is a cross-sectional view illustrating a structure of the electrode substrate film according to the present invention.

FIG. 2 is a graph diagram illustrating a relationship between a wavelength (nm) and a refractive index (n) for each of metal absorption layers formed under deposition conditions A to E.

FIG. 3 is a graph diagram illustrating a relationship between a wavelength (nm) and an extinction coefficient (k) for each of the metal absorption layers formed under the deposition conditions A to E.

FIG. 4 is a graph diagram illustrating a relationship between a wavelength (nm) and a reflectance (%) for each of metal absorption layers of film thicknesses 0 nm, 5 nm, 10 nm, 15 nm, 20 nm, 25 nm, and 30 nm formed under the deposition condition A (oxygen concentration of 0%).

FIG. 5 is a graph diagram illustrating a relationship between a wavelength (nm) and a reflectance (%) for each of the metal absorption layers of film thicknesses 0 nm, 5 nm, 10 nm, 15 nm, 20 nm, 25 nm, and 30 nm formed under the deposition condition B (oxygen concentration of 11%).

FIG. 6 is a graph diagram illustrating a relationship between a wavelength (nm) and a reflectance (%) for each of the metal absorption layers of film thicknesses 0 nm, 5 nm, 10 nm, 15 nm, 20 nm, 25 nm, and 30 nm formed under the deposition condition C (oxygen concentration of 23%).

FIG. 7 is a graph diagram illustrating a relationship between a wavelength (nm) and a reflectance (%) for each of the metal absorption layers of film thicknesses 0 nm, 5 nm, 10 nm, 15 nm, 20 nm, 25 nm, and 30 nm formed under the deposition condition D (oxygen concentration of 28%).

FIG. 8 is a graph diagram illustrating a relationship between a wavelength (nm) and a reflectance (%) for each of the metal absorption layers of film thicknesses 0 nm, 5 nm, 10 nm, 15 nm, 20 nm, 25 nm, and 30 nm formed under the deposition condition E (oxygen concentration of 33%).

FIG. 9 is an explanatory diagram of a deposition apparatus (sputtering web coater) which carries out a vacuum deposition method of forming a metal absorption layer and a metal layer on a transparent substrate formed of a resin film.

BEST MODES FOR PRACTICING THE INVENTION

An embodiment of the present invention is described below in detail with reference to the drawings.

(1) Optical Constants (Refractive Index and Extinction Coefficient) and Film Thickness Conditions for Metal Absorption Layer (1-1) In a case of forming a metal absorption layer by a sputtering method as an example of a vacuum deposition method, the metal absorption layer mentioned above is formed while introducing a reactive gas such as oxygen or nitrogen gas into an apparatus (which is referred to as a sputtering web coater, and a sputtering target, a deposition material, is attached to a cathode inside a deposition apparatus) which carries out the sputtering method. Here, it is difficult to automatically determine a deposition condition (added amount of reactive gas such as oxygen or nitrogen gas) because it is affected by, for example, a shape of the deposition apparatus, a conveyance speed of a resin film being a transparent substrate, a deposition rate at the sputtering cathode, and a positional relationship among reactive gas discharge pipes, the sputtering cathode, and the resin film. The deposition condition described above is derived for every deposition apparatus from the added amount of reactive gas introduced and characteristic results of the deposited metal absorption layer.

(1-2) Experiments were repeatedly carried out for deposition of the metal absorption layer, simulation of the optical thin-film, and the etching property or the like of the metal absorption layer. As a result, the present inventor has found that there exist the optimum optical constants (refractive index and extinction coefficient) and film thickness condition of the metal absorption layer which make a spectral reflectance low in a visible wavelength range (400 to 780 nm) and enable etching without difficulty, as described above.

(1-3) A graph diagram of FIG. 2 illustrates a relationship between a wavelength (nm) and a refractive index (n) for each of metal absorption layers subjected to oxygen reactive sputter deposition under deposition conditions A to E to be described later with use of a Ni-based alloy (Ni—W) target, and a graph diagram of FIG. 3 illustrates a relationship between a wavelength (nm) and an extinction coefficient (k) for each of the metal absorption layers deposited under the deposition conditions A to E described above.

Note that the deposition conditions A to E are, specifically, the deposition condition A (oxygen concentration of 0%), the deposition condition B (oxygen concentration of 11%), the deposition condition C (oxygen concentration of 23%), the deposition condition D (oxygen concentration of 28%), and, the deposition condition E (oxygen concentration of 33%).

The graph diagrams of FIG. 2 and FIG. 3 show a drastic change in the optical constants (refractive index and extinction coefficient) depending on the degree of oxidation of the Ni-based alloy (Ni—W). The oxidation state is lowest for deposition condition A (oxygen concentration of 0%), and the oxidation state tends to be high toward the deposition condition E (oxygen concentration of 33%).

Hence, it is difficult to identify a metal absorption layer to be formed by the deposition material (metal material such as the Ni-based alloy) and the deposition condition (added amount of reactive gas such as oxygen or nitrogen gas). It is desirable to specify the metal absorption layer based on the optical constants thereof.

(1-4) Next, graph diagrams of FIG. 4 to FIG. 8 illustrate a spectral reflectance property attributed to reflection at an interface between a resin film (PET: polyethylene terephthalate film) and the metal absorption layer and an interface between the metal absorption layer and the metal layer (copper) for each of laminate films which are fabricated by depositing, for example, copper (metal layer) with a film thickness of 80 nm on the metal absorption layer formed on the PET film under the deposition conditions A to E. Note that the film thickness of the metal absorption layer is changed at intervals of 5 nm within a range from 0 nm (without the metal absorption layer) to 30 nm.

From the graph diagram of FIG. 4, it can be said that, regarding the spectral reflectance property, an average reflectance is high under the deposition condition A (oxygen concentration of 0%) with the lowest oxidation state of the metal absorption layer, and a rate of change in reflectance decreases with an increasing film thickness. On the other hand, from the graph diagram of FIG. 8, it can be said that, regarding the spectral reflectance property, although the average reflectance is low under the deposition condition E (oxygen concentration of 33%) with the highest oxidation state of the metal absorption layer, a flatness of the spectral reflectance property (difference between the highest reflectance and the lowest reflectance) is large.

(1-5) Moreover, Table 1 below shows whether the etching property is good or not for a laminate film which is fabricated by depositing copper (metal layer) with a film thickness of 80 nm on the metal absorption layer formed under each of the deposition conditions A to E described above (in relation to how difficult or easy to etch and form the layered film of the laminate film into a laminate thin line, "○" represents the case where etching can easily be performed, and "x" represents the case where etching is difficult), and film thicknesses satisfying the condition that the highest reflectance is 40% or less (the film thicknesses are changed at intervals of 5 nm within a range from 5 nm to 30 nm, and are represented by "○" if satisfying the condition and by "x" if not satisfying the condition).

TABLE 1

| Deposition Condition | Film Thickness (nm) | Highest Reflectance 40% or less | Etching Property |
|---|---|---|---|
| A | 5 | x | ○ |
|   | 10 | x |   |
|   | 15 | x |   |
|   | 20 | x |   |
|   | 25 | x |   |
|   | 30 | x |   |
| B | 5 | x | ○ |
|   | 10 | x |   |
|   | 15 | x |   |
|   | 20 | ○ |   |
|   | 25 | ○ |   |
|   | 30 | ○ |   |
| C | 5 | x | ○ |
|   | 10 | x |   |
|   | 15 | ○ |   |
|   | 20 | ○ |   |
|   | 25 | ○ |   |
|   | 30 | ○ |   |
| D | 5 | x | ○ |
|   | 10 | x |   |
|   | 15 | ○ |   |
|   | 20 | ○ |   |
|   | 25 | ○ |   |
|   | 30 | ○ |   |
| E | 5 | x | x |
|   | 10 | x |   |
|   | 15 | x |   |
|   | 20 | ○ |   |
|   | 25 | ○ |   |
|   | 30 | ○ |   |

(1-6) In view of the above, when choosing, from the graph diagrams of FIG. 4 to FIG. 8 and Table 1, a metal absorption layer which satisfies the condition that the highest reflectance in the visible wavelength range (400 to 780 nm) of the laminate film is 40% or less and the metal absorption layer does not deteriorate the etching property of the layered film (metal absorption layer and metal layer) in the laminate film, a metal absorption layer is selected which is deposited under the deposition condition B (oxygen concentration of 11%), the deposition condition C (oxygen concentration of 23%), or the deposition condition D (oxygen concentration of 28%), and the film thickness thereof ranges from 20 nm to 30 nm inclusive.

Thereafter, when determining, from the graph diagrams of FIG. 2 and FIG. 3, the optical constants (refractive index and extinction coefficient) in the visible wavelength range (400 to 780 nm) of the metal absorption layer deposited under each of the deposition condition B (oxygen concentration of 11%), the deposition condition C (oxygen concentration of 23%), and the deposition condition D (oxygen concentration of 28%), the results follow that the refractive index is 1.8 to 2.2 and the extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm.

(1-7) Then, in a case where the film thickness of the metal absorption layer deposited on the PET film ranges from 20 nm to 30 nm inclusive, and the optical constants (refractive index and extinction coefficient) in the visible wavelength range (400 to 780 nm) of the metal absorption layer described above satisfy the above-mentioned conditions, i.e., the refractive index is 1.8 to 2.2 and the extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm, the metal absorption layer satisfies the condition that the highest reflectance in the visible wavelength range (400 to 780 nm) attributed to reflection at an interface between the PET film and the metal absorption layer and an interface between the metal absorption layer and the metal layer (copper, for example) is 40% or less. Thus, reflection on the metal layer observed on the resin film (PET film) side is reduced. Furthermore, the etching property of the layered film (metal absorption layer and metal layer) in each laminate film is not deteriorated.

Here, the material for the metal absorption layer which possesses the property that the highest reflectance in the visible wavelength range (400 to 780 nm) becomes 40% or less and the etching property of the layered film (metal absorption layer and metal layer) in each laminate film is not deteriorated when the metal absorption layer has a film thickness of 20 nm to 30 nm inclusive and satisfies the above-described conditions for the optical constants (refractive index and extinction coefficient) is not limited to the Ni-based alloy (Ni—W) mentioned above. For example, it has been demonstrated that the above property can also be achieved by a metal absorption layer formed of Ni alone or a Ni-based alloy containing at least one element selected from Ti, Al, V, Ta, Si, Cr, Ag, Mo, and Cu, and Cu alone or a Cu-based alloy containing at least one element selected from Ti, Al, V, W, Ta, Si, Cr, Ag, Mo, and Ni.

(2) Electrode Substrate Film according to Present Invention and Laminate Film Used for Manufacture of Same (2-1) Electrode Substrate Film According to Present Invention As illustrated in FIG. 1(C), the electrode substrate film according to the present invention including a transparent substrate 52 formed of a resin film, and a mesh circuit pattern provided on the transparent substrate 52 and formed of a metal laminate thin line, is characterized in that the laminate thin line includes a metal absorption layer 51 with a film thickness of 20 nm to 30 nm inclusive as a first layer, and a metal layer 50 as a second layer, counted from the transparent substrate 52 side, the optical constants of the metal absorption layer 51 in the visible wavelength range (400 to 780 nm) satisfy the conditions that the refractive index is 1.8 to 2.2 and the extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm, and a highest reflectance in the visible wavelength range (400 to 780 nm) attributed to reflection at the interface between the transparent substrate 52 and the metal absorption layer 51 and the interface between the metal absorption layer 51 and the metal layer 50 is 40% or less.

In addition, the electrode substrate film is characterized in that the metal laminate thin line includes a second metal absorption layer with a film thickness of 20 nm to 30 nm inclusive as a third layer, counted from the transparent substrate 52 side, and the optical constants of the second metal absorption layer in the visible wavelength range (400 to 780 nm) satisfy the conditions that the refractive index is 1.8 to 2.2 and the extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm.

(2-2) Laminate Film Used for Manufacture of Electrode Substrate Film According to Present Invention As illustrated in FIG. 1(A), the above-described laminate film including a transparent substrate 42 formed of a resin film and the layered film provided on the transparent substrate 42, is characterized in that the layered film includes a metal absorption layer 41 with a film thickness of 20 nm to 30 nm inclusive as a first layer, and a metal layer 40 as a second layer, counted from the transparent substrate 42 side, the optical constants of the metal absorption layer 41 in the visible wavelength range (400 to 780 nm) satisfy the conditions that the refractive index is 1.8 to 2.2 and the extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm, and as illustrated in FIGS. 1(A) to 1(B), the highest reflectance in the visible wavelength range (400 to 780 nm) attributed to reflection at the interface between the transparent substrate 42 and the metal absorption layer 41 and the interface between the metal absorption layer 41 and the metal layer 40 is 40% or less.

In addition, the laminate film described above is characterized in that the layered film includes a second metal absorption layer with a film thickness of 20 nm to 30 nm inclusive as a third layer, counted from the transparent substrate 42 side, and the optical constants of the second metal absorption layer in the visible wavelength range (400 to 780 nm) satisfy the conditions that the refractive index is 1.8 to 2.2 and the extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm.

(3) Constituent Materials for Electrode Substrate Film and Above-Described Laminate Film According to Present Invention (3-1) Resin Film Constituting Transparent Substrate The materials for the resin film applied to the electrode substrate film and the above-described laminate film according to the present invention are not particularly limited, and their specific examples include a resin film alone selected from resin materials of polyethylene terephthalate (PET), polyethersulfone (PES), polyarylates (PAR), polycarbonate (PC), polyolefins (PO), triacetyl cellulose (TAC), and norbornene, or a composite material of a resin film alone selected from the above-mentioned resin materials and an acrylic organic film covering one or both of the surfaces of this resin film alone. In particular, typical examples of the norbornene resin material include Zeonoa (trade name) manufactured by Zeon Corporation, ARTON (trade name) manufactured by JSR Corporation, and the like.

Note that since the electrode substrate film according to the present invention is used for "touch panels" and the like, it desirably has excellent transparency in the visible wavelength range, among the resin films described above.

(3-2) Metal Absorption Layer

As described earlier, the film material for the metal absorption layer according to the present invention is preferably Ni alone or a Ni-based alloy containing at least one element selected from Ti, Al, V, W, Ta, Si, Cr, Ag, Mo, and Cu, and Cu alone or a Cu-based alloy containing at least one element selected from Ti, Al, V, W, Ta, Si, Cr, Ag, Mo, and Ni.

Besides, the metal absorption layer has a deposition material of Ni alone or the Ni-based alloy, or Cu alone or the Cu-based alloy described above, and is formed by the vacuum deposition method in which reactive gas is introduced into the deposition apparatus. The vacuum deposition method mentioned above includes magnetron sputtering, ion-beam sputtering, vacuum vapor deposition, ion plating, and CVD. In addition, the above-described reactive gas includes oxygen or nitrogen gas alone, a gas mixture of these, or a gas mixture containing argon or the like with oxygen and nitrogen as the main components.

What is more, the optical constants (refractive index and extinction coefficient) of the metal absorption layer at various wavelengths are greatly affected by the degree of reaction, i.e. the oxidation state or the degree of nitration, and are not determined only by the constituent material of the metal absorption layer.

(3-3) Metal Layer

The constituent material for the metal layer according to the present invention is not particularly limited as long as the material is a metal with a low electrical resistance value, and its examples include Cu alone or a Cu-based alloy containing at least one element selected from Ti, Al, V, W, Ta, Si, Cr, and Ag, or Ag alone or a Ag-based alloy containing at least one element selected from Ti, Al, V, W, Ta, Si, Cr, and Cu. Cu alone is particularly desirable in terms of the formability and resistance value of the circuit pattern.

In addition, although the film thickness of the metal layer depends on its electrical characteristics and is not determined by optical factors, it is usually set to a film thickness at a level where transmitted light cannot be measured.

Moreover, a desirable film thickness of the metal layer is preferably 50 nm or more, and more preferably 60 nm or more in terms of electrical resistance. On the other hand, the film thickness is preferably 5 μm (5000 nm) or less, and more preferably 3 μm (3000 nm) or less in terms of formability of forming the metal layer into a wiring pattern.

(4) Deposition Apparatus Used for Carrying Out Vacuum Deposition Method (4-1) Sputtering Web Coater The sputtering method is taken as an example of the vacuum deposition method, and its deposition apparatus is described.

Here, this deposition apparatus is referred to as a sputtering web coater and is used in a case where a surface of a long resin film being conveyed in a roll-to-roll manner is subjected to a deposition treatment continuously and efficiently.

To be more specific, the deposition apparatus (sputtering web coater) for the long resin film conveyed in a roll-to-roll manner is provided inside a vacuum chamber 10 as illustrated in FIG. 9. The structure is such that the long resin film 12 unwound from an unwind roll 11 is subjected to a prescribed deposition treatment, and is thereafter wound by a wind roll 24. A can roll 16 rotationally driven by a motor is disposed in the middle of a conveyance path from the unwind roll 11 to the wind roll 24. Circulating inside this can roll 16 is a coolant the temperature of which has been adjusted outside the vacuum chamber 10.

Inside the vacuum chamber 10, for sputter deposition, pressure is reduced to an ultimate pressure of approximately $10^{-4}$ Pa and is thereafter adjusted to approximately 0.1 to 10 Pa by introducing sputtering gas. The sputtering gas used is a known gas such as argon and is further containing a gas such as oxygen or nitrogen depending on the purpose. The shape and the material for the vacuum chamber 10 are not particularly limited and various options can be adopted as long as it can withstand such a reduced pressure state. In addition, the vacuum chamber 10 has various apparatuses (not illustrated) integrated thereto such as a dry pump, turbomolecular pump, and cryocoil for reducing the pressure inside vacuum chamber 10 and maintaining the reduced pressure state.

A free roll 13 which guides the long resin film 12 and a tension sensor roll 14 which measures a tension of the long resin film 12 are disposed in this order on the conveyance path from the unwind roll 11 to the can roll 16. Meanwhile, the long resin film 12 forwarded from the tension sensor roll 14 toward the can roll 16 is adjusted relative to a peripheral speed of the can roll 16 by an upstream feed roll 15 which is driven by a motor and is provided near the can roll 16. This makes it possible to bring the long resin film 12 into close contact with an outer peripheral surface of the can roll 16.

In the same manner as described above, a downstream feed roll 21 which is driven by a motor and performs adjustment relative to the peripheral speed of the can roll 16, a tension sensor roll 22 which measures the tension of the long resin film 12, and a free roll 23 which guides the long resin film 12 are disposed in this order also on the conveyance path from the can roll 16 to the wind roll 24.

At the unwind roll 11 and the wind roll 24 described above, the tension balance of the long resin film 12 is maintained through torque control by a powder clutch or the like. Additionally, the long resin film 12 is unwound from the unwind roll 11 and wound by the wind roll 24 through the rotation of the can roll 16, and the upstream feed roll 15 and the downstream feed roll 21 which are driven by motors and rotate in synchronization with the can roll 16.

Provided near the can roll 16 are magnetron sputtering cathodes 17, 18, 19, and 20 as a means of deposition at positions facing the conveyance path (i.e., a region of the outer peripheral surface of the can roll 16 around which the long resin film 12 is wound) defined on the outer peripheral surface of the can roll 16. Reactive gas discharge pipes 25, 26, 27, 28, 29, 30, 31, and 32 which discharge reactive gas are installed in this vicinity.

When sputter deposition is to be carried out for the above-described metal absorption layer and the metal layer, a plate-shaped target can be used as illustrated in FIG. 9. In the case where a plate-shaped target is used, however, a nodule (growth of an unwanted matter) may be produced on the target. In a case where this gives rise to a problem, it is preferable to use a cylindrical rotary target, with which nodules are not produced and the usage efficiency of the target is high.

(4-2) Reactive Sputtering

In a case where an oxide target or a nitride target is used for the purpose of forming the metal absorption layer described above, they are not suitable for mass production because the deposition rate is slow. For this reason, a metal target is employed which enables fast deposition and a method is adopted in which the above-described reactive gas is controlled when being introduced during the deposition.

Below are four known methods of controlling the reactive gas mentioned above:

(4-2-1) a method of discharging reactive gas at a constant flow rate.

(4-2-2) a method of discharging reactive gas so as to maintain a constant pressure.

(4-2-3) a method of discharging reactive gas such that the impedances of the sputtering cathodes are constant (impedance control).

(4-2-4) a method of discharging reactive gas such that the sputtering plasma intensity is constant (plasma emission control).

(5) Method of Manufacturing Electrode Substrate Film (5-1) It is possible to obtain the electrode substrate film according to the present invention by etching the layered film (layered film including the metal absorption layer 41 as a first layer, and the metal layer 40 as a second layer, counted from the transparent substrate 42 side) of the laminate film described above and forming the layered film into a metal laminate thin line to create a wiring pattern. Then, an electrode (wiring) pattern of the electrode substrate film is formed into a stripe shape or a grid shape for a touch panel. Thereby, the electrode substrate film according to the present invention can be used for a touch panel.

Moreover, since the metal laminate thin line formed into the electrode (wiring) pattern maintains a laminate structure of the above-described laminate film, the highest reflectance in the visible wavelength range (400 to 780 nm) attributed to reflection at an interface between the transparent substrate and the metal absorption layer and an interface between the metal absorption layer and the metal layer is a low value of 40% or less. As a result, it is possible to provide an electrode substrate film in which the circuit pattern of electrodes and the like provided on the transparent substrate is less visible even under highly bright illumination. Besides, it is possible to provide an electrode substrate film with which excellent processing accuracy can be achieved in creating the circuit pattern of electrodes and the like because it does not cause trouble in etching. Furthermore, a metal laminate thin line with a larger line width (for example, a line width of 20 µm or less) compared to a conventional one can be applied. Thus, the present invention has an effect that it can provide an electrode substrate film with a low electrical resistance value.

(5-2) Furthermore, for forming the above-described laminate film into an electrode substrate film according to the present invention to create a wiring pattern, a known subtractive method can be used.

The subtractive method is a method of creating a wiring pattern by forming a photoresist film on the surface of the layered film of the laminate film, performing exposure and development so that the photoresist film remains at an area where the wiring pattern is wished to be created, and removing, by chemical etching, the layered film at an area without the photoresist film on the surface of the layered film described above.

A hydrogen peroxide-based etching liquid and an aqueous solution of ceric ammonium nitrate can be used as an etching liquid for the chemical etching mentioned above. Furthermore, an aqueous solution of ferric chloride and an aqueous solution of copper(II) chloride, as well as a hydrochloric acid acidified aqueous solution of permanganate salt and an acetic acid acidified aqueous solution of permanganate salt can also be used. In the present invention, these aqueous solution of ferric chloride, aqueous solution of copper(II) chloride, hydrochloric acid acidified aqueous solution of permanganate salt, and acetic acid acidified aqueous solution of permanganate salt are desirable.

EXAMPLE

Hereinbelow, an example of the present invention is described in detail.

Note that an ellipsometer was used in the measurement of optical characteristics (refractive index and extinction coefficient) of the metal absorption layer, and a self-recording spectrophotometer was used in the measurement of the spectral reflectance property.

Example 1

The deposition apparatus (sputtering web coater) illustrated in FIG. 9 was used and oxygen gas was employed as the reactive gas. The amount of reactive gas was controlled through the impedance control described above.

Note that the can roll 16 is made of stainless steel with a diameter of 600 mm and a width of 750 mm, and a surface of the roll is plated with hard chrome. Each of the upstream feed roll 15 and the downstream feed roll 21 is made of stainless steel with a diameter of 150 mm and a width of 750 mm, and a surface of each roll is plated with hard chrome. Besides, the reactive gas discharge pipes 25, 26, 27, 28, 29, 30, 31, and 32 are installed on the upstream side and the downstream side of the cathodes 17, 18, 19, and 20. Moreover, a Ni—W target for the metal absorption layer was attached to the cathode 17, and a Cu target for the metal layer to the cathodes 18, 19, and 20.

In addition, a PET film with a width of 600 mm was used for the resin film constituting the transparent substrate, and the temperature of the can roll 16 was controlled and cooled to be at 0° C. What is more, the pressure inside the vacuum chamber 10 was reduced to 5 Pa by exhausting the gas therein through multiple dry pumps, and was further reduced to $3 \times 10^{-3}$ Pa using multiple turbomolecular pumps and cryocoils.

(1) Manufacture of Laminate Film for Manufacturing Electrode Substrate Film

Thereafter, the conveyance speed of the resin film was set to 4 m/min. After that, 300 sccm of argon gas (sputtering gas) was introduced through the reactive gas discharge pipes 25 and 26 described above, and the power for the cathode 17 was controlled such that metal absorption layers (oxide films of Ni—W) with film thicknesses of 0 nm, 5 nm, 10 nm, 15 nm, 20 nm, 25 nm, and 30 nm would be deposited. Here, the reactive gas (oxygen gas) was introduced as a gas mixture to the reactive gas discharge pipes 25 and 26.

The above-mentioned oxygen gas was used as the reactive gas, and the oxygen gas was controlled to a prescribed concentration using a piezo valve. The concentration conditions for the oxygen gas to be introduced were the deposition condition A (oxygen concentration of 0%), the deposition condition B (oxygen concentration of 11%), the deposition condition C (oxygen concentration of 23%), the deposition condition D (oxygen concentration of 28%), and the deposition condition E (oxygen concentration of 33%).

Note that since the deposition rate is expected to decrease depending on the amount of oxygen gas introduced, it is necessary to adjust sputtering power in order to obtain the intended film thicknesses of the metal absorption layer.

On the other hand, 300 sccm of argon gas (sputtering gas) was introduced through the reactive gas discharge pipes 27, 28, 29, 30, 31 and 32 described above, and the power for the cathodes 18, 19, and 20 was controlled such that a metal layer (Cu layer) with a film thickness of 80 nm would be formed. The laminate films of multiple kinds provided to the manufacture of electrode substrate films were manufactured by depositing the metal layer (Cu layer) with a film thickness of 80 nm on each of the metal absorption layers with film thicknesses of 0 nm, 5 nm, 10 nm, 15 nm, 20 nm, 25 nm, and 30 nm, which were deposited under the deposition condition A (oxygen concentration of 0%) to the deposition condition E (oxygen concentration of 33%).

(2) Manufacture of Electrode Substrate Film

Next, the electrode substrate films according to the example were manufactured by the known subtractive method using the obtained laminate films of multiple kinds.

To be more specific, the electrode substrate films according to the example were manufactured by forming a photoresist film on the surface of the layered film of the laminate film described above (layered film formed of the metal absorption layer and the metal layer), performing exposure and development so that the photoresist film would remain at an area where a wiring pattern was wished to be created, and removing, by chemical etching, the layered film at an area without the photoresist film on the surface of the above-described layered film.

The circuit pattern of electrodes and the like was a stripe one with a wiring width of 5 μm and an interval of 300 μm.

Incidentally, a hydrochloric acid acidified aqueous solution of permanganate salt was used as the etching liquid for the chemical etching in this example. Besides, in the chemical etching, the laminate film with the photoresist film after the development was immersed in the etching liquid.

Confirmation (1) Spectral reflectances of the laminate films of multiple kinds in the visible wavelength range (400 to 780 nm) attributed to reflection at an interface between the PET film and the metal absorption layer and an interface between the metal absorption layer and the metal layer were measured from the PET film side using a self-recording spectrophotometer, the laminate films being obtained by depositing metal absorption layers on PET films so that their film thicknesses were 0 nm, 5 nm, 10 nm, 15 nm, 20 nm, 25 nm, and 30 nm under the deposition conditions A to E described above, and thereafter depositing metal layers (Cu layers) with a film thickness 80 nm.

The results are shown in the graph diagrams of FIG. 4 to FIG. 8.

(2) On the other hand, the optical constants (refractive index and extinction coefficient) of the laminate films of 5 kinds in the visible wavelength range (400 to 780 nm) under the deposition conditions A to E were measured from the PET film side using an ellipsometer, the laminate films being obtained by depositing metal absorption layers with a film thickness of 20 nm under the deposition conditions A to E, and thereafter depositing metal layers (Cu layers) with a film thickness of 80 nm on these metal absorption layers.

The results are shown in the graph diagrams of FIG. 2 to FIG. 3.

Note that since the optical constants are constants independent of the film thickness, the optical constant were measured for the laminate films of 5 kinds in which the metal absorption layers with a film thickness of 20 nm are deposited, as described above.

(3) Moreover, the hydrochloric acid acidified aqueous solution of permanganate salt was utilized as the etching liquid to examine the "etching property" of the laminate films of multiple kinds, and Table 1 above shows the obtained results. The metal absorption layer was etched and thereafter the periphery of the wiring pattern was checked for the above-mentioned "etching property" with an optical microscope. Etching was successfully performed for the metal absorption layers formed under the deposition condition A (oxygen concentration of 0%) and the deposition condition B (oxygen concentration of 11%) without etching residues on the periphery of the wiring pattern. Slight etching residues were observed on part of the periphery of the wiring pattern for the metal absorption layers formed under the deposition condition C (oxygen concentration of 23%) and the deposition condition D (oxygen concentration of 28%), but there was no practical problem. However, the metal absorption layer formed under the deposition condition E (oxygen concentration of 33%) was not suitable for practical use because there were etching residues on the periphery of the wiring pattern.

Furthermore, visual check was carried out from the metal absorption layer side for the conductive substrate films including the metal absorption layers with a film thickness of 20 nm formed under the deposition conditions A, B, C, and D described above, and for the conductive substrate film including the metal absorption layer with a film thickness of 15 mm formed under the deposition condition B described above. In the checking, a conductive substrate film was placed such that a surface on the opposite side from where the conductive substrate film was visually checked was in contact with a liquid crystal display panel.

The circuit pattern of electrodes and the like was visible in each of the conductive substrate film including the metal absorption layer with a film thickness of 20 nm formed under the deposition condition A, and the conductive substrate film including the metal absorption layer with a film thickness of 15 nm formed under the deposition condition B described above. On the other hand, the circuit pattern of electrodes and the like was less visible in the conductive substrate film including the metal absorption layer with a film thickness of 20 nm formed under the deposition condition B, and in the conductive substrate films including the metal absorption layers with a film thickness of 20 nm formed under the deposition conditions C and D described above. In particular, the circuit pattern of electrodes and the like in the conductive substrate films including the metal absorption layers with a film thickness of 20 nm formed under the deposition conditions C and D was much less visible compared to that in the conductive substrate film including the metal absorption layer with a film thickness of 20 nm formed under the deposition condition B.

(4) In view of the above, when choosing, from the graph diagrams of FIG. 4 to FIG. 8 and Table 1, a metal absorption layer which satisfies the condition that the highest reflectance in the visible wavelength range (400 to 780 nm) of the laminate film is 40% or less and the metal absorption layer does not deteriorate the etching property of the layered film (metal absorption layer and metal layer) in the laminate film, a metal absorption layer is selected which is deposited under the deposition condition B (oxygen concentration of 11%), the deposition condition C (oxygen concentration of 23%), or the deposition condition D (oxygen concentration of 28%), and the film thickness thereof ranges from 20 nm to 30 nm inclusive. Thereafter, when determining, from the graph diagrams of FIG. 2 and FIG. 3, the optical constants (refractive index and extinction coefficient) in the visible wavelength range (400 to 780 nm) of the metal absorption layer deposited under each of the deposition condition B (oxygen concentration of 11%), the deposition condition C (oxygen concentration of 23%), and the deposition condition D (oxygen concentration of 28%) described above, the results follow that the refractive index is 1.8 to 2.2 and the extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm.

(5) After that, in a case where the film thickness of the metal absorption layer deposited on the PET film ranges from 20 nm to 30 nm inclusive, and the optical constants (refractive index and extinction coefficient) in the visible wavelength range (400 to 780 nm) of the metal absorption layer described above satisfy the above-mentioned conditions, i.e., the refractive index is 1.8 to 2.2 and the extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm, the metal absorption layer satisfies the condition that the highest reflectance in the visible wavelength range (400 to 780 nm) attributed to reflection at an interface between the PET film and the metal absorption layer and an interface between the metal absorption layer and the metal layer (copper) is 40% or less. Thus, reflection on the metal layer observed on the resin film (PET film) side is reduced. Furthermore, the etching property of the layered film (metal absorption layer and metal layer) in each laminate film is not deteriorated.

(6) In other words, when a laminate film is applied in which the metal absorption layer deposited on the PET film has a film thickness of 20 nm to 30 nm inclusive, and the optical constants (refractive index and extinction coefficient) in the visible wavelength range (400 to 780 nm) of the metal absorption layer satisfy the conditions that the refractive index is 1.8 to 2.2 and the extinction coefficient is 1.8 to 2.4 at a wavelength of 400 nm, the refractive index is 2.2 to 2.7 and the extinction coefficient is 1.9 to 2.8 at a wavelength of 500 nm, the refractive index is 2.5 to 3.2 and the extinction coefficient is 1.9 to 3.1 at a wavelength of 600 nm, the refractive index is 2.7 to 3.6 and the extinction coefficient is 1.7 to 3.3 at a wavelength of 700 nm, and the refractive index is 3.1 to 3.8 and the extinction coefficient is 1.5 to 3.4 at a wavelength of 780 nm, it has been confirmed that it is to possible to provide an electrode substrate film with which excellent processing accuracy can be achieved in creating the circuit pattern of electrodes and the like and in which the above-mentioned circuit pattern is less visible even under highly bright illumination.

(7) In the example, the metal absorption layer is formed with use of a Ni—W target and the metal layer is made of copper. The same effects have been confirmed for the above-mentioned metal absorption layer when a different Ni alloy or Cu alloy target is used as long as the optical constants are within the range described above. Also, the same effects have been confirmed for the above-mentioned metal layer when the Cu-based alloy described above, Ag alone, or the Ag-based alloy described above is applied instead of Cu (copper).

In addition, also as for the etching liquid, it has been confirmed that an acetic acid acidified aqueous solution of permanganate salt, an aqueous solution of ferric chloride, and an aqueous solution of copper(II) chloride are applicable instead of the hydrochloric acid acidified aqueous solution of permanganate salt described above.

POSSIBILITY OF INDUSTRIAL APPLICATION

An electrode substrate film according to the present invention is industrially applicable to a "touch panel" installed on a surface of an FPD (flat panel display) because a circuit pattern of electrodes and the like provided on a transparent substrate is less visible even under highly bright illumination.

REFERENCE SIGNS LIST 10 vacuum chamber
11 unwind roll
12 long resin film
13 free roll
14 tension sensor roll
15 upstream feed roll
16 can roll
17 magnetron sputtering cathode
18 magnetron sputtering cathode
19 magnetron sputtering cathode
20 magnetron sputtering cathode
21 downstream feed roll
22 tension sensor roll
23 free roll
24 wind roll
25 reactive gas discharge pipe
26 reactive gas discharge pipe
27 reactive gas discharge pipe
28 reactive gas discharge pipe 29 reactive gas discharge pipe
30 reactive gas discharge pipe
31 reactive gas discharge pipe
32 reactive gas discharge pipe
40 metal layer
41 metal absorption layer
42 transparent substrate
50 metal layer
51 metal absorption layer
52 transparent substrate

The invention claimed is:

1. An electrode substrate film including a transparent substrate formed of a resin film, and a mesh circuit pattern provided on the transparent substrate and formed of a metal laminate thin line, characterized in that
the laminate thin line has a line width of 20 μm or less and includes a metal absorption layer with a film thickness of 20 nm to 30 nm inclusive as a first layer, and a metal layer as a second layer, counted from the transparent substrate side,
optical constants of the metal absorption layer in a visible wavelength range (400 to 780 nm) satisfy conditions that
a refractive index is 1.8 to 2.2 and an extinction coefficient is 1.8 to 2.4 at a wavelength of 400 nm,
the refractive index is 2.2 to 2.7 and the extinction coefficient is 1.9 to 2.8 at a wavelength of 500 nm,
the refractive index is 2.5 to 3.2 and the extinction coefficient is 1.9 to 3.1 at a wavelength of 600 nm,
the refractive index is 2.7 to 3.6 and the extinction coefficient is 1.7 to 3.3 at a wavelength of 700 nm, and
the refractive index is 3.1 to 3.8 and the extinction coefficient is 1.5 to 3.4 at a wavelength of 780 nm, and
a highest reflectance in the visible wavelength range (400 to 780 nm) attributed to reflection at an interface between the transparent substrate and the metal absorption layer and an interface between the metal absorption layer and the metal layer is 40% or less.

2. The electrode substrate film according to claim 1, characterized in that
the metal laminate thin line includes a second metal absorption layer with a film thickness of 20 nm to 30 nm inclusive as a third layer, counted from the transparent substrate side, and
optical constants of the second metal absorption layer in the visible wavelength range (400 to 780 nm) satisfy conditions that
a refractive index is 1.8 to 2.2 and an extinction coefficient is 1.8 to 2.4 at a wavelength of 400 nm,
the refractive index is 2.2 to 2.7 and the extinction coefficient is 1.9 to 2.8 at a wavelength of 500 nm,
the refractive index is 2.5 to 3.2 and the extinction coefficient is 1.9 to 3.1 at a wavelength of 600 nm,
the refractive index is 2.7 to 3.6 and the extinction coefficient is 1.7 to 3.3 at a wavelength of 700 nm, and
the refractive index is 3.1 to 3.8 and the extinction coefficient is 1.5 to 3.4 at a wavelength of 780 nm.

3. The electrode substrate film according to claim 1, characterized in that
a deposition material of the metal absorption layer includes Ni alone or a Ni-based alloy containing at least one element selected from Ti, Al, V, W, Ta, Si, Cr, Ag, Mo, and Cu, or Cu alone or a Cu-based alloy containing at least one element selected from Ti, Al, V, W, Ta, Si, Cr, Ag, Mo, and Ni.

4. The electrode substrate film according to claim 1, characterized in that
the metal absorption layer is formed by a vacuum deposition method, and the optical constants of the metal absorption layer, which are the refractive index and the extinction coefficient, are adjusted by introducing the deposition material of the metal absorption layer which includes Ni alone or a Ni-based alloy containing at least one element selected from Ti, Al, V, W, Ta, Si, Cr, Ag, Mo, and Cu, or Cu alone or a Cu-based alloy containing at least one element selected from Ti, Al, V, W, Ta, Si, Cr, Ag, Mo, and Ni and a reactive gas into a deposition apparatus in which the vacuum deposition method is carried out.

5. The electrode substrate film according to claim 4, characterized in that
the reactive gas includes oxygen or nitrogen gas alone, a gas mixture thereof, or a gas mixture with oxygen and nitrogen as main components.

6. The electrode substrate film according to claim 1, characterized in that
a film thickness of the metal layer ranges from 50 nm to 5000 nm inclusive.

7. The electrode substrate film according to claim 2, characterized in that
a deposition material of the metal absorption layer includes Ni alone or a Ni-based alloy containing at least one element selected from Ti, Al, V, W, Ta, Si, Cr, Ag, Mo, and Cu, or Cu alone or a Cu-based alloy containing at least one element selected from Ti, Al, V, W, Ta, Si, Cr, Ag, Mo, and Ni.

8. The electrode substrate film according to claim 2, characterized in that
the metal absorption layer is formed by a vacuum deposition method, and the optical constants of the metal absorption layer, which are the refractive index and the extinction coefficient, are adjusted by introducing the deposition material of the metal absorption layer which includes Ni alone or a Ni-based alloy containing at least one element selected from Ti, Al, V, W, Ta, Si, Cr, Ag, Mo, and Cu, or Cu alone or a Cu-based alloy containing at least one element selected from Ti, Al, V, W, Ta, Si, Cr, Ag, Mo, and Ni and a reactive gas into a deposition apparatus in which the vacuum deposition method is carried out.

9. The electrode substrate film according to claim 8, characterized in that
the reactive gas includes oxygen or nitrogen gas alone, a gas mixture thereof, or a gas mixture with oxygen and nitrogen as main components.

* * * * *